United States Patent [19]

Mindock

[11] Patent Number: 4,754,141
[45] Date of Patent: Jun. 28, 1988

[54] MODULATED INFRARED SOURCE

[75] Inventor: Ralph M. Mindock, Longwood, Fla.

[73] Assignee: High Technology Sensors, Inc., Longwood, Fla.

[21] Appl. No.: 910,553

[22] Filed: Sep. 23, 1986

Related U.S. Application Data

[63] Continuation-in-part of Ser. No. 768,437, Aug. 22, 1985, abandoned.

[51] Int. Cl.$^4$ ............................................. H01L 33/00
[52] U.S. Cl. ................................. 250/343; 250/493.1; 250/504 R; 357/17
[58] Field of Search ................ 250/338 GA, 341, 343, 250/493.1, 495.1, 503.1, 504 R, 552; 357/17, 19, 58; 372/25, 50

[56] References Cited

U.S. PATENT DOCUMENTS

| | | | |
|---|---|---|---|
| 3,309,553 | 3/1967 | Kroemer | 313/499 |
| 3,504,240 | 3/1970 | Dahlberg | 357/28 |
| 3,715,636 | 2/1973 | Jaffe et al. | 357/17 |
| 3,768,037 | 10/1973 | Migitaka et al. | 372/26 |
| 3,962,692 | 6/1976 | Murphy et al. | 340/598 |
| 3,973,852 | 8/1976 | Moore et al. | 356/438 |
| 4,009,482 | 2/1977 | Nakata | 357/28 |
| 4,050,083 | 9/1977 | Jaskolski et al. | 357/28 |
| 4,090,212 | 5/1978 | Byatt et al. | 357/24 |
| 4,127,792 | 11/1978 | Nakata | 313/500 |
| 4,163,238 | 7/1979 | Esaki et al. | 357/17 |
| 4,202,000 | 5/1980 | Carballes | 357/19 |
| 4,231,149 | 11/1980 | Chapman et al. | 29/578 |
| 4,240,088 | 12/1980 | Myers | 357/19 |
| 4,388,633 | 6/1983 | Vasudev | 357/17 |

FOREIGN PATENT DOCUMENTS 0003091  1/1978  Japan ..................................... 372/50

Primary Examiner—Janice A. Howell
Assistant Examiner—Constantine Hannaher
Attorney, Agent, or Firm—Newton, Hopkins & Ormsby

[57] ABSTRACT

A solid state infrared source is disclosed which is capable of modulation of the intensity of broadband infrared radiation. A silicon semiconductor body is provided with doped regions which have high emissivity for infrared and an intrinsic region which has low emissivity and low absorption for the infrared. The device is heated and maintained at a temperature of about 500°K to effect the infrared radiation from the doped regions. Modulation is effected by controlling the presence of carriers in the intrinsic region, so as to modify the broadband infrared radiation. The modulating carriers may be due to optical modulation or they may be injected electrically. In either case, the heating may be effected by an external device or the doped regions may also provide a heating PIN diode structure which is forward biased in controlled fashion to attain the desired temperature. With electrical modulation, the doped regions provide at least a modulating PIN diode structure which is periodically forward biased to control the presence of carriers in the intrinsic region which modify the emission of infrared radiation from this region. With optical modulation, carriers are created in the semiconductor by subjecting it to a source of light. The device is useful for providing an IR source in many applications including a component in an electro-optical system for gas spectroscopy.

54 Claims, 5 Drawing Sheets

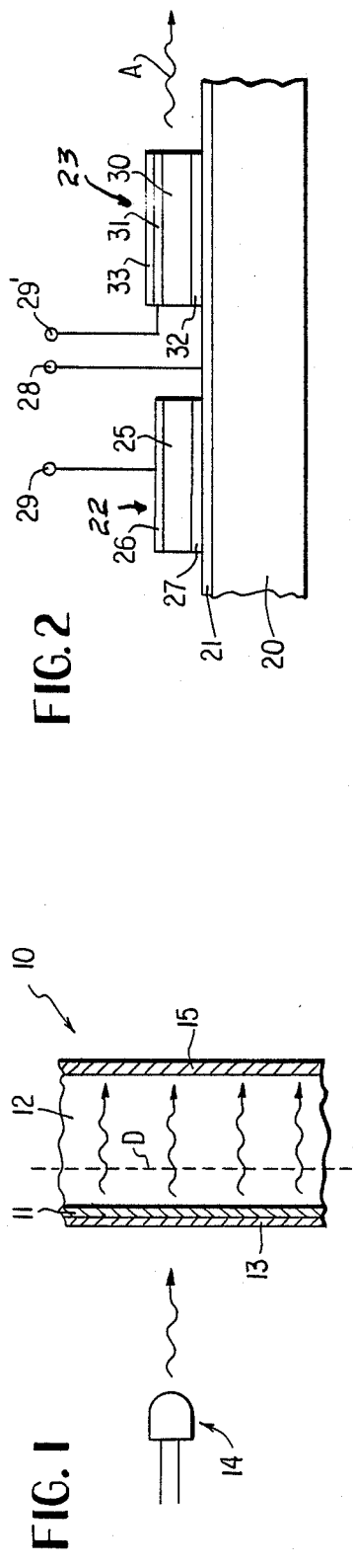
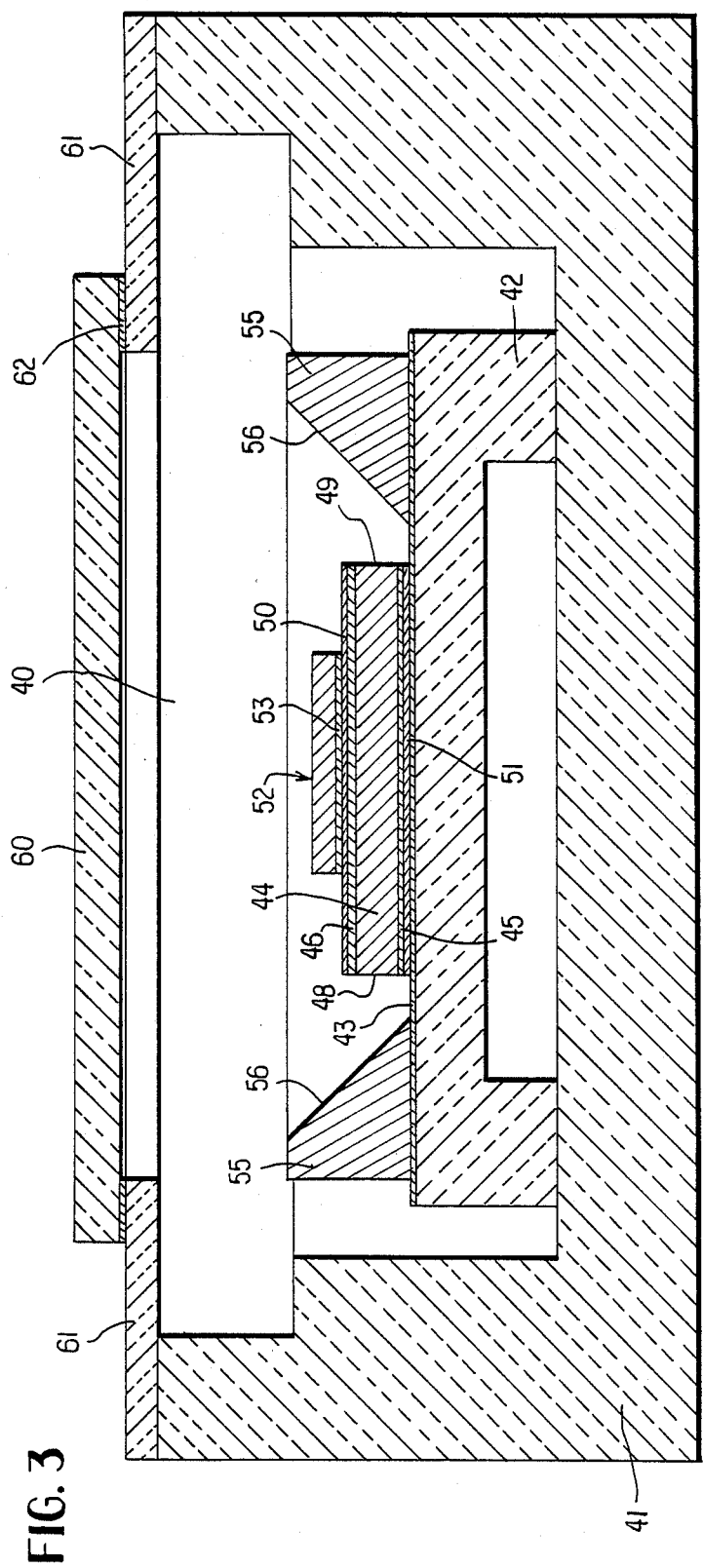
FIG. 1
FIG. 2
FIG. 3

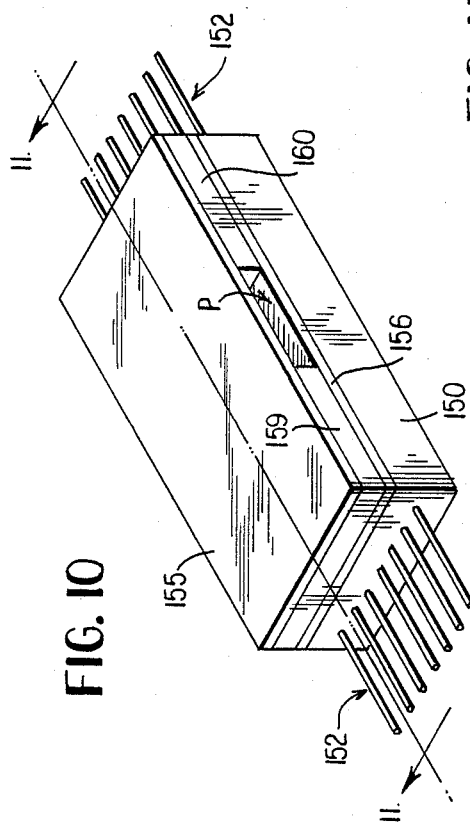
FIG. 10
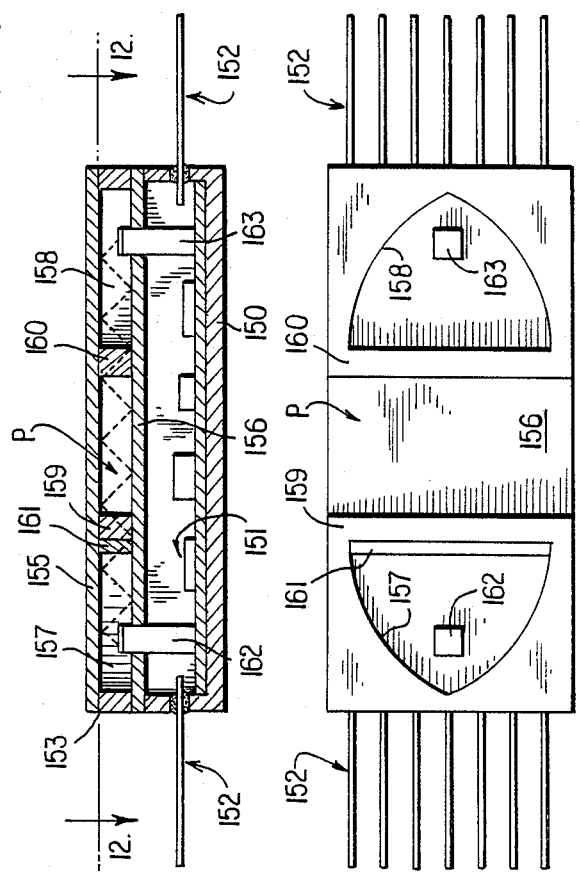
FIG. 11
FIG. 12
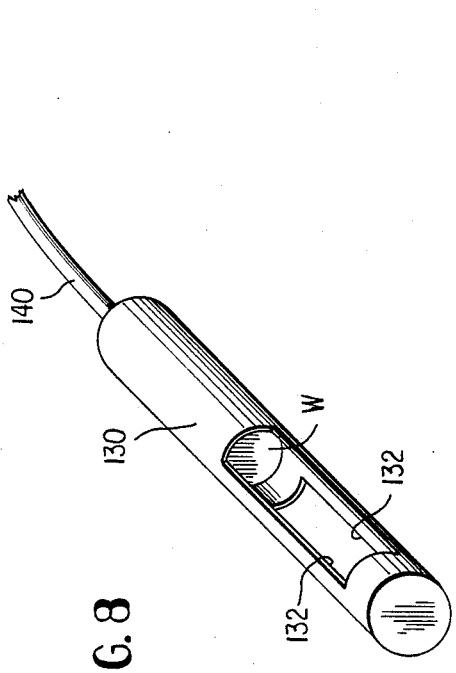
FIG. 8
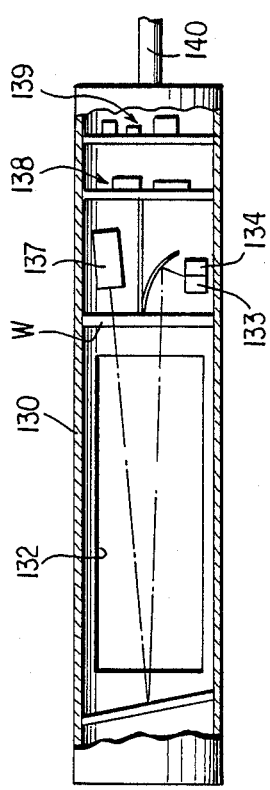
FIG. 9

MODULATED INFRARED SOURCE

REFERENCE TO RELATED APPLICATION

This is a continuation-in-part of application Ser. No. 768,437, filed Aug. 22, 1985, now abandoned.

BACKGROUND OF THE INVENTION

1. Field of the Invention

The invention relates to semiconductor electromagnetic radiation sources which may be modulated, and in particular to semiconductor infrared sources capable of modulation. According to this invention, a semiconductor body is provided with means for causing it thermally to emit broadband infrared radiation in a spectrum of interest at a meaningful intensity, and also with modulating means for controllably modifying the emission of such radiation, thereby modulating the output intensity of the device. The modulating means controls the presence of carriers within the body, correspondingly to modify the emission of such radiation from the body. The presence of carriers may be controlled optically and it may be controlled electrically.

2. Prior Art

LED devices are known in the prior art and operate by injecting carriers into the semiconductor so that when electrons and holes recombine, radiation within a narrow optical spectrum is emitted, provided the band structure favors this emission (direct band gap materials). Thus, this class of device depends upon the presence of free carriers which, upon electron-hole recombination, causes the device to emit. When used as infrared sources, such devices require cooling for effective operation and, as noted, the injection of free carriers causes the emission.

Another class of device is also known for providing a source of infrared radiation and this type of device uses heated filaments, heated cavities or various arc techniques. These devices are externally modulated, usually with a mechanical chopper wheel. Mechanical chopper wheel devices have been developed so as periodically to block or mask the light emitted by such sources. Such choppers are cumbersome and are limited mechanically so that restriction of speed at which the modulation may be effected is inherent.

The switching of semiconductor devices by means of optical input is known from the Myers U.S. Pat. No. 4,240,088 of Dec. 16, 1980, whereas switching by means of thermal input is known from the Nakata U.S. Pat. No. 4,009,482 of Feb. 27, 1977, the Murphy et al U.S. Pat. No. 3,962,692 of June 8, 1976 and the Jaskoluski et al U.S. Pat. No. 4,050,083 Sept. 20, 1977.

It is also known to utilize semiconductor bodies integrally formed with light-emissive semiconductor devices from the Vasudev U.S. Pat. No. 4,388,633 June 14, 1983, the Chapman et al U.S. Pat. No. 4,231,149 Nov. 4, 1980 and the Carballes U.S. Pat. No. 4,202,000 of May 6, 1980.

Other U.S. patents of interest are the Esaki et al U.S. Pat. No. 4,163,238, the Nakata U.S. Pat. No. 4,127,792, the Byatt et al U.S. Pat. No. 4,090,212 and the Dahlberg U.S. Pat. No. 3,504,240.

BRIEF SUMMARY OF THE INVENTION

In contrast to the prior art, the invention relates to a semiconductor device which is conditioned thermally to emit broadband radiant energy and is provided with carrier modulating means for controllably modifying the emission of such radiant energy. Basically, then, the invention is directed to modulation of emissivity from a thermally-emitting semiconductor by controlling the presence of modulating carriers within the emitting material. To my knowledge, such a device has not heretofore been known.

In accord with the invention, the semiconductor device is provided with thermal input to cause it to emit infrared radiation and with modulating means which controls the presence of modulating carriers within the device correspondingly to modify the infrared radiation. The modulating means may be in the form of optical means controlling the presence of modulating carriers within the semiconductor body. The modulating means may also be in the form of electrical input, again, controlling the presence of modulating carriers within the semiconductor body. In any event, the presence of modulating carriers within the body is controlled so as to modify radiation emitted from the body.

In another aspect, the invention is concerned to create modulated conditions within the semiconductor device. During the unmodulated conditions, the semiconductor device thermally emits the electromagnetic radiation due to the presence of an equilibrium concentration of carriers and during modulated conditions the device is subjected to internal absorption or enhancement of the electromagnetic radiation due to the presence of carriers in excess of an equilibrium concentration thereof. The energy absorbed by the modulating carriers is not fully released until carrier thermal equilibrium and until thermal equilibrium, the emittance from the device will be decreased. The length of time during which this decrease in emission occurs will be determined by the carrier heat capacity and other thermal effects. After carrier thermal equilibrium the emission will be increased. Thus, the pulse width and duty cycle of the modulating input are adjusted to assure that the device exhibits modulated emission.

In one form of the invention, the semiconductor device provides a PIN structure for modulation whereas in another form of the invention optical modulation is employed. In all forms of the invention, the semiconductor is formed to have a portion which has low emissivity and hence low absorption in the wavelength of interest. Also, in all forms of the invention means is provided to heat the semiconductor and maintain it at the required temperature. In one embodiment, discrete PIN diode arrangements are provided, a PIN diode to provide the heat input and another PIN diode to provide the modulating input. In this structure, the presence of carriers or holes in excess of an equilibrium concentration thereof is controlled by the modulating diode to modify the infrared radiation generated by the heating means in accord with the modulating input. Since the modulation depends upon the lifetime of the carriers injected by the modulating diode, the dimensions of the semiconductor body are chosen to assure that such lifetime is commensurate with the modulation to be effected. Of primary importance in this respect is the influence of electron-hole recombination due to surface recombination. Carrier lifetimes of as little as 12 microseconds have been demonstrated as practical for the device.

Other and different embodiments of this invention will be apparent as this description proceeds.

BRIEF DESCRIPTION OF THE DRAWING FIGURES

FIG. 1 is a phenomenological model of the invention using optical control of modulation;

FIG. 2 is a cross-section of a prototype version of the invention using electrical modulation;

FIG. 3 is a cross-section of one embodiment of the invention using discrete components and employing electrical modulation;

FIG. 8 is a perspective view of a humidity sensor employing the concepts of this invention;

FIG. 9 is a cross-section of the device of FIG. 8;

FIG. 10 is a perspective view of a moisture sensor employing the concepts of this invention;

FIG. 11 is a cross-section of the device of FIG. 10;

FIG. 12 is a horizontal section through the device of FIG. 11;

DETAILED DESCRIPTION OF THE INVENTION

Figure 4:
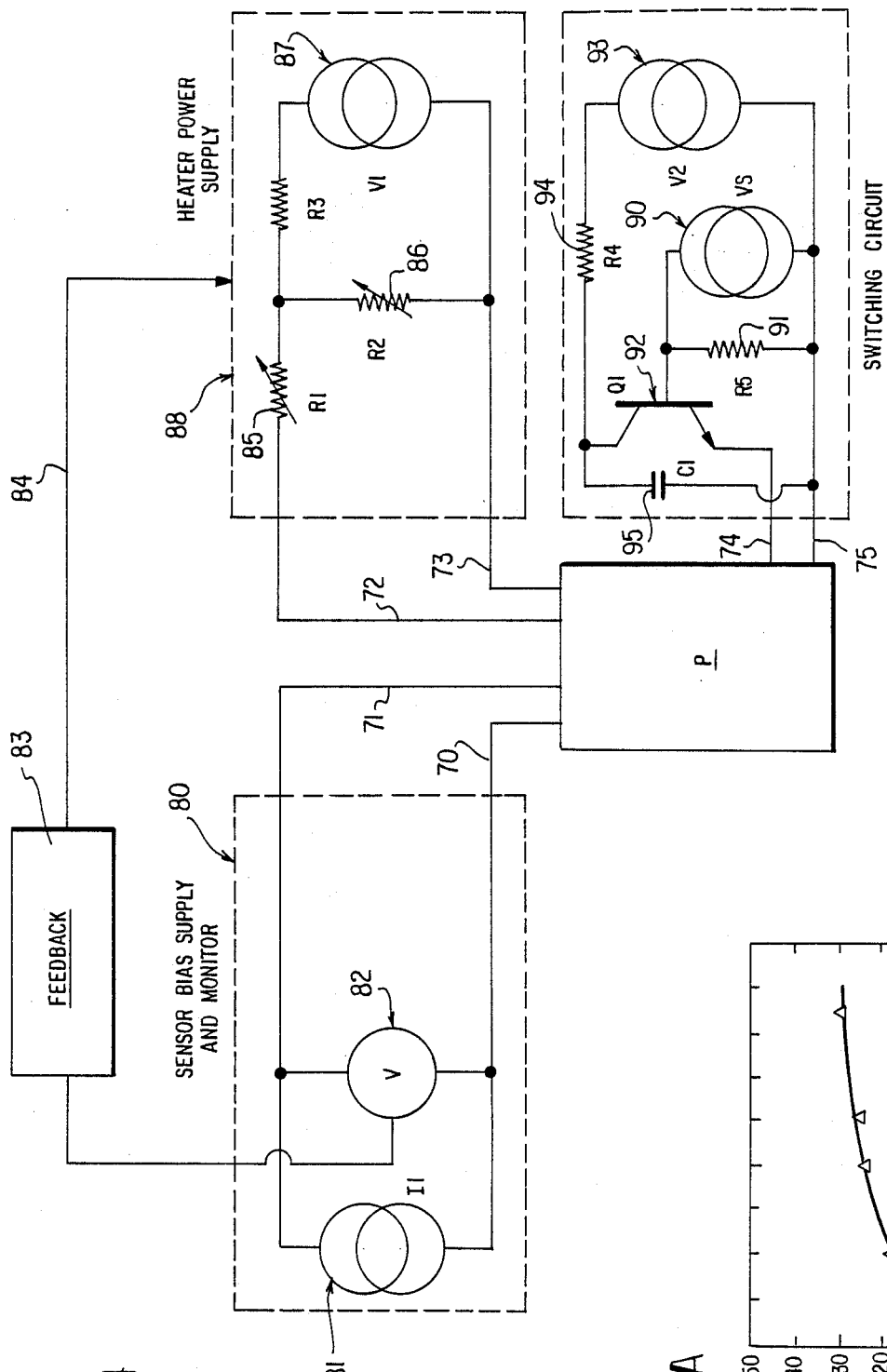
FIG. 4 is a diagrammatical view of the electrical circuit employed with the embodiment of FIG. 3.

With reference to FIG. 1, the semiconductor device illustrated therein includes the semiconductor body 10 having a p- or n-type diffused region 11 formed on the intrinsic region 12. It is to be noted that the term "intrinsic" as used throughout this specification and the claims herein identifies a semiconductor material which has low emissivity and hence low absorption of the wavelength of interest. The surface of the diffused region 11 is provided with an anti-reflective coating 13 for the modulating input from the 0.9 micron light source 14. The diffused region 11 is heated and is composed to emit infrared radiation, preferably over a spectrum of from 3-12 microns. The intrinsic region 12 is of a material which has low emissivity for the emitted radiation and is provided with a coating of anti-reflecting material 15 for the emitted radiation and thus provides a window for the infrared radiation emitted by the diffused region 11. In the absence of the modulating light input from the source 14, the radiation emitted by the heated diffused region 11 passes through the intrinsic region 12 and exits from the surface of the coating 15. When the source 14 is energized to emit the modulating light, it passes through the anti-reflective coating 13 and the diffused region 11 to penetrate into the intrinsic region 12 to control the presence of carriers therein which modify the emitted radiation sufficiently to effect the desired modulation. In the embodiment illustrated, the wavelength of the modulating light was selected to be outside the wavelength band of interest and of such intensity as to effect the desired modulation. The optical energy creates carriers in excess of an equilibrium concentration thereof which modify the emitted radiation while penetrating to the depth D. Dependent upon the intensity of modulation and pulse width, the carriers created in excess of the equilibrium concentration may absorb or enhance all of the infrared emitted by the diffused region 11.

This embodiment demonstrates that by providing a semiconductor 12 having low emissivity in the wavelength of interest, provided with a surface or region 11 having high emissivity in the wavelength of interest when heated, in combination with means for optically creating carriers which have absorption and hence thermal emission in the wavelength of interest, effective modulation can be achieved. The invention operates because the surface or region 11 emits broadband radiation depending upon its temperature and emissivity. This radiative output can be described by Plank's equation. The semiconductor material 12, because of its low emissivity and hence low absorption in the wavelength of interest, will act as a window for the radiation from the region 11. When carriers are optically created in the semiconductor material 12, they initially absorb the radiation emitted by the region 11 and hence there is a reduction in output from the device. When the carriers reach thermal equilibrium within the semiconductor, the radiative emittance will be increased.

Figure 2A:
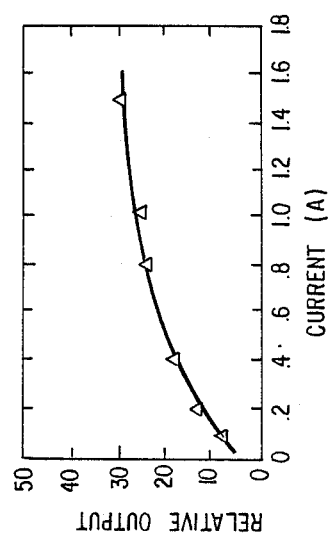
FIG. 2A is a graph illustrating modulating characteristics of the prototype of FIG. 2.

FIG. 2 illustrates a prototype of the invention constructed to demonstrate the effectiveness of the concept employing electrical modulation. Reference character 20 indicates an insulating slab which forms the support base of the device and it is provided with a slab 21 of electrically and thermally conducting material to which two PIN devices 22 and 23 are suitably bonded so as to be in electrical and thermal contact therewith. The PIN device 22 provides the intrinsic region 25 and the regions 26 and 27 of opposite type, one being a p-region and the other being an n-region. The electrical terminals 28 and 29 are shown connected to the region 26 and, through the slab 21, to the region 27 to provide electrical input to the PIN device 22. This device is forward biassed to heat the slab 21 and thus provide the necessary heat input to the device 23 to cause it to emit in the wavelength of interest. The temperature to which the device is heated and controlled is 500° K. The device 23 includes the intrinsic region 30 having the opposite type regions 31 and 32 formed therein as shown. The device 23 was a silicon PIN device with regions 31 and 32 of boron and phosphorous having high emissivity in the wavelength of interest, i.e., a spectrum including the wavelength of 4.0 microns which was used for detection as hereinafter described. Thus, the heating provided by the PIN device 22 causes both regions 31 and 32 to emit infrared radiation which exits the intrinsic region as indicated by the arrow A. A coating 33 of material having low emissivity for the wavelength of interest may be provided on the exposed surface of region 31. The PIN device 23 is provided with the terminal 29' connected to the region 31 and the region 32 is electrically connected through the slab 21 to the previously mentioned terminal 28. By forward biassing the PIN device 23 at the electrical terminals 28 and 29′, the presence of carriers within the intrinsic region 30 in excess of the equilibrium concentration is controlled. These carriers are thus injected electrically into the intrinsic region 30 to modify the output emitted from the side edge of the intrinsic region 30 as indicated at A. FIG. 2A is a typical graph of biassing current of the modulating PIN device versus relative output of the device 23. The infrared output was measured using a PbSe detector having a peak response of approximately 4.0 micron.

FIG. 3 illustrates an improved form of infrared source according to this invention. The source shown is an enclosed package having an evacuated and sealed interior cavity 40. The support for the device is provided by the isolating material 41 and the components of the package are mounted on the thermal insulator portion 42 having the electrically conductive layer 43. The semiconductor body 44 is the starting material is a material such as P type float zone grown silicon of a resistivity of 5,000 ohm-cm or greater which is approximately 0.016 inches thick. This silicon material has a low emissivity in the wavelengths of interest, namely from 3 microns to 12 microns. The material is doped at the regions 45 and 46 with impurities to form a PIN structure. The doped regions are at a concentration level greater than $1 \times 10^{20}$ per $cm^3$ and at a depth between 0.2 and 1.0 micron. These doped regions provide areas of high emissivity in the infrared. The doping is done so that a black body radiator is approximated and this is accomplished by providing a ratio of doped area to undoped area which is greater than 5. Thus, the physical dimensions of the body 44 must be such that the area of the exposed side edges as at 48 and 49 of the intrinsic portion is less than 1/5 of the areas of the doped regions.

The doped region 46 is provided with a covering 50 of material having low emissivity in the wavelength of interest. The region 45 is bonded as illustrated functionally at 51 to provide good thermal and electrical contact with the electrically and thermally conducting layer 43 which bonds the device to the thermal insulator 42. The covering 50 is provided with the heating means 52 bonded thereto by the layer of material 53 having good thermal conductivity. The heating means 52 may take any desired form although it is preferred that it be in the form of a chip having diffused resistors which are electrically energized and provided with means for sensing the temperature of the device. This chip may be a type SNOOK20FD available from Texas Instruments, part number MPSK61.

Also mounted to the thermal insulator 42 through the layer 43 is the reflector mechanism 55 having metallized reflecting surfaces 56 inclined with respect to the exposed side edges 48, 49 of the semiconductor body to reflect the radiation exiting therefrom upwardly in the Figure to pass through the window provided by the transparent material 60. This window may be sealed to the plate 61 by suitable material and the plate 61 may also be sealed to the isolator body 41, allowing the interior 40 of the package to be evacuated if desired to lower power requirements. The semiconductor may be of circular plan view and the reflector 55 may be in the form of a ring surrounding same.

Although not illustrated for the sake of clarity since such techniques are well known in the art, the package is provided with suitable conductive leads for the various electrical components. A schematic for the electrical circuitry is illustrated in FIG. 4. As shown, there are six leads 70, 71, 72, 73, 74 and 75 which extend into the package 41 illustrated in FIG. 3. The two leads 70 and 71 are connected to the temperature sensing structure mentioned above in connection with the chip 52 and are applied to the sensor bias supply and monitor circuit 80. A constant current source 81 is connected to the sensing junction and the voltage across this junction is measured as at 82. The measured voltage is applied to the feedback circuit 83 whose output at 84 is used to control the voltage supplied to the heating means 53 over the leads 72 and 73. The feedback control may be to the variable resistors 85 and 86 which control the power supplied to the heating means from the voltage source 87. The two resistors 85 and 86 with the voltage source 87 comprise the heater power supply circuit 88. The heating chip heats the doped regions of the semiconductor material to a set temperature (preferable 500° K.) so that the infrared radiation is emitted. Carriers in excess of the thermal equilibrium concentration are injected into the semiconductor under the control of the modulating source symbolically shown at 90. The modulating signal generated is applied across the input resistor 91 to bias the transistor switch 92 closed so that the leads 74 and 75 to the doped regions 45 and 46 are connected to the voltage source 93. The voltage source 93 forward biasses the doped regions and is capable of providing high current limited by the resistor 94. The capacitor 95 is provided for fast switching. When modulating carriers are injected into the semiconductor material they absorb the infrared radiation being emitted from the doped regions. The injection of modulating carriers prohibits or occludes the emission of a portion of the radiation from the device. After the carriers reach thermal equilibrium, the emissivity of the device will be increased. The device may be pulsed between the "off" state (reverse bias, no bias or low forward bias) for normal radiative output and the "on" state (forward bias) for reduced or enhanced radiative output to transmit signals of various amplitude and frequency.

Figure 5:
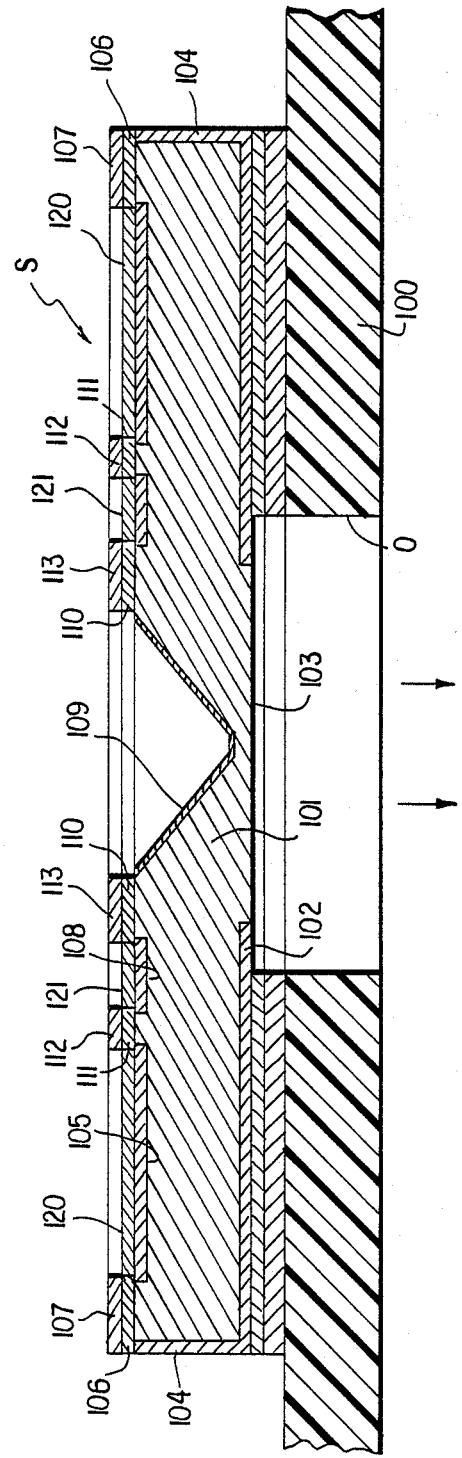
FIG. 5 is a cross-section through a further embodiment of the invention.
Figure 6:
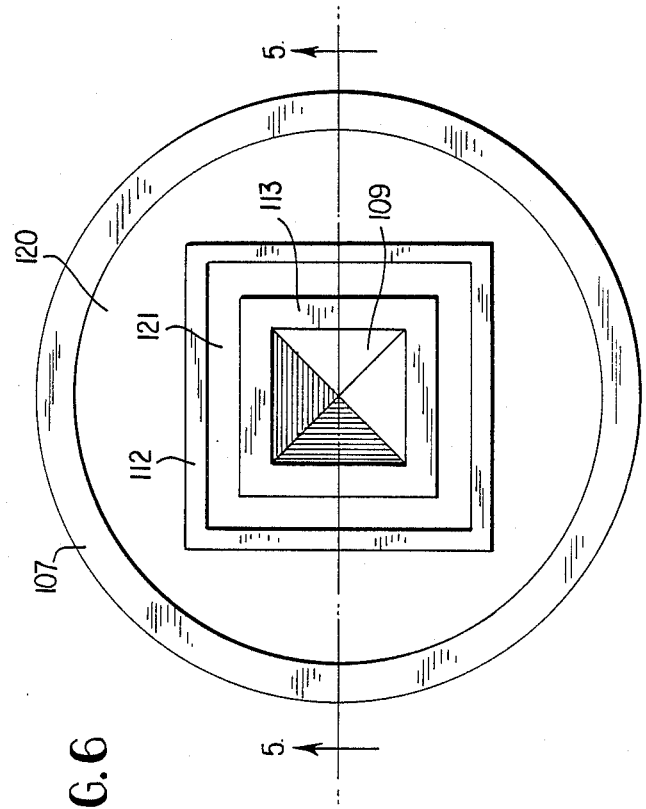
FIG. 6 is a plan view of the embodiment of FIG. 5.

FIG. 5 illustrates a further refinement in structural details of the infrared source. In this configuration, a suitable substrate 100 is provided having an opening O. The infrared source S is of silicon material doped as aforesaid. The semiconductor may be circular as shown in FIG. 6 and the intrinsic region 101 is doped on its bottom surface as at 102 to leave an exposed surface 103 registered with the opening O. This doping 102 extends over the side edge of the semiconductor as indicated at 104. Doping of the opposite type is provided at the top surface as at 105 and is of circular form as shown in FIG. 6 to leave a gap between it and the doped regions 104. This gap is covered by an oxide layer 106 which is provided with a reflective layer 107. As is also shown in FIG. 6, the doped region 105, coated with the overlying layer of low emissive material 120 for the wavelength of interest, provides the central opening which is of rectangular form to provide a gap between it and the further doped region 108 coated with the overlying layer of material 121. It will be appreciated that the doped region 108 must be of the opposite type with respect to the region 102 and, likewise that the region 105 must be of opposite type to that of the region 102. Stated otherwise, in the embodiment of FIGS. 5 and 6, two PIN diode structures must be provided, one for heating and the other for modulation in similar fashion to FIG. 2. It will be obvious to those of ordinary skill in the art that various combinations and permutations are possible in retaining the two PIN diode configurations. The semiconductor is etched centrally and provided with the reflective coating 109 to leave a gap between this coating and the doped region 108. This gap is bridged by the oxide layer 110 whereas the gap between the doped regions 105 and 108 is bridged by the oxide layer 111. These two oxide layers are coated with the reflective material layers 112 and 113.

The doped regions are separated by the relatively narrow gaps to reduce surface recombination effects and thereby allow a higher rate of modulation. The heating means may be effected between the PIN structure formed between the doped regions 102 and 105 whereas the modulating signal is applied between the doped regions 102 and 108, the principles of operation being as explained above.

Figure 7:
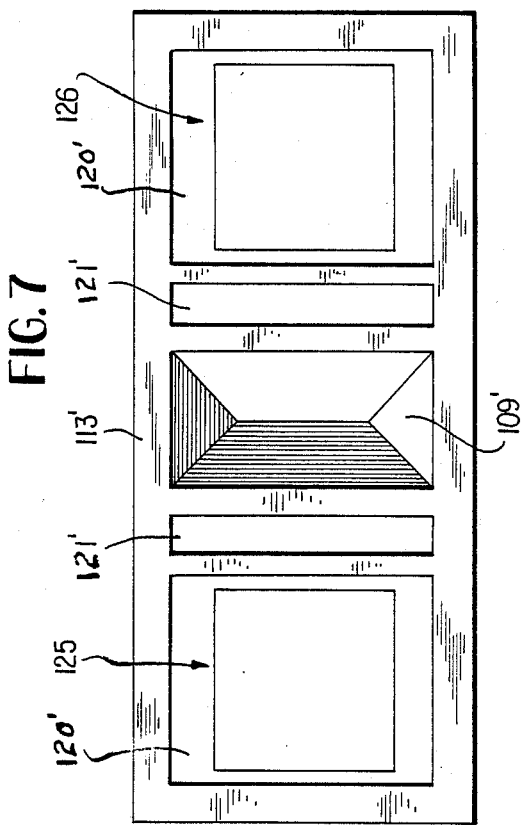
FIG. 7 is a plan view of a modification of the FIG. 5 embodiment.

As shown in FIG. 7 as a modification of the FIG. 5 construction, the semiconductor material may also be of rectangular configuration and two heating/sensing chip means as described in conjunction with FIGS. 3 and 4 are indicated by the reference characters 125 and 126 to replace the heating diode means of FIGS. 5 and 6. Otherwise, the corresponding reference characters are primed in FIG. 7 to illustrate similar elements of FIGS. 5 and 6. It will be noted that the reflective coating 113' covers much of the upper surface of the device and that it encompasses those coatings corresponding to 107 and 112 of FIG. 6. Also, whereas there are discrete regions corresponding to the regions 108 in FIG. 5, as indicated by the overlying coatings 121' in FIG. 7, and 105 in FIG. 5 as indicated by the overlying layer 120' in FIG. 7, and of course regions corresponding to 102 in FIG. 5 to complete the modulating diode structures. No heating diode structures are required so that the regions corresponding to 104 and 105 need not be of opposite type. It will be appreciated that the chips 125 and 126 must be in good thermal contact with the semiconductor material as in FIGS. 2 and 3. Also, it will be appreciated that underlying the coatings 113' are regions corresponding with the regions 110, 111 and 106 of FIG. 5. Thus, aside from shape, the principal difference between FIGS. 5 and 7 is that in the latter, external heating is employed, eliminating the need for the heating PIN diode structure of FIG. 5.

Figure 7A:
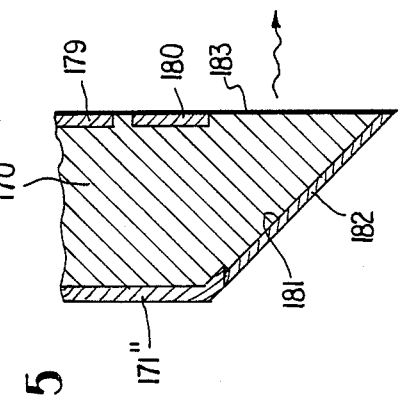
FIG. 7A is a plan view similar to FIG. 7 but showing a modified form of the invention.
Figure 6A:
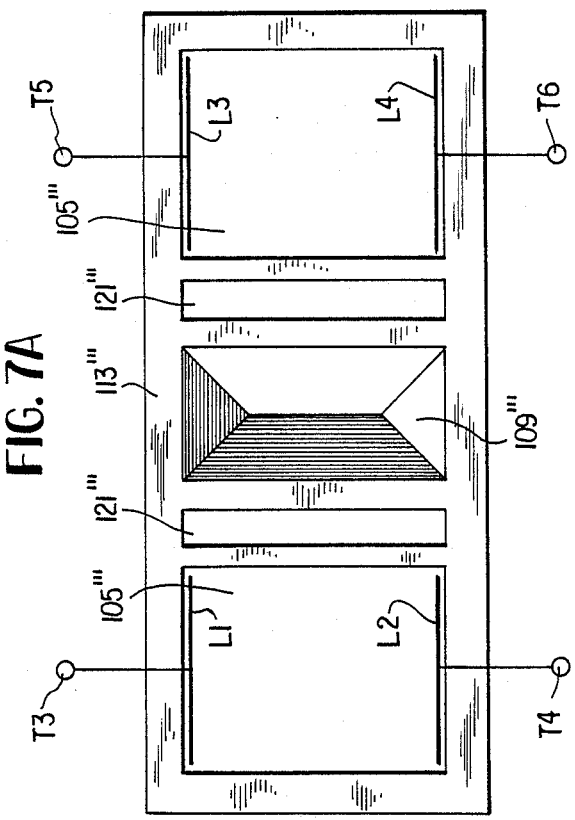
FIG. 6A is a plan view similar to FIG. 6 but showing a modified form of the invention.

Another alternative to the heating PIN diode structure or of the chips 125, 126 would be to use the resistance between two contacts placed in electrical contact with the doped region 105 in FIG. 5, for example. Such an arrangement is illustrated in FIG. 6A where double primed reference characters are employed to relate to FIG. 6. In this embodiment, the region 105" is provided with two circular spots S1 and S2 of conductive material in electrical contact with the region 105" and suitable terminals T1 and T2 are connected thereto so that current applied through the resistance afforded by the region 105" will control the heating. Obviously, those of skill in the art will understand that other and different arrangements will also be effective to provide the requisite heating. For example, a similar arrangement may be provided as in FIG. 7A. In this Figure, where triple primed reference characters are used to relate to FIG. 7, the regions 105''' thereof are provided with lines of electrical contact L1, L2, L3 and L4 with corresponding terminals T3, T4, T5 and T6. Again, as in FIG. 6A, the resistance afforded by the regions 105''' will provide the requisite heating.

FIGS. 8 and 9 illustrate a practical use of the infrared source according to this invention. In FIG. 8, the body 130 of a probe is illustrated, having a side opening 132 to admit ambient atmosphere to sense its humidity or gas content. As shown in FIG. 9, the probe houses an inclined reflector 135 at one end and a curved reflector 136 adjacent the two sources 133 and 134 and beyond the window W. An infrared detector 137 is also located beyond the window W and the path between the two sources and the detector is illustrated by dotted lines. The probe also houses suitable electronics as indicated at 138 and 139, all components being supplied electrically by the probe lead 140. The two sources are filtered to provide radiation in the 5 to 8 micron region to measure water absorption in the 8 to 10 micron region to normalize the system for dust, particles and scratches encountered in the normal operating environment. The optical paths from the two sources back to the detector are nearly identical. The approach relies heavily on the absorption characteristics of water in the selected band, the output characteristics of the sources and the detectivity of the detector, according to principles well known in the art.

The sensor illustrated in FIGS. 8 and 9 uses discrete components, but miniaturization with planar implementation using integrated guided optics is possible as is illustrated in FIGS. 10-12. FIG. 10 illustrates the miniature package having the base section 150 housing the electronics 151 with suitable leads 152 as shown in FIG. 11, and the upper section 153 containing the optics. The upper section 153 is provided in laminate form, consisting of the two plates 155 and 156 separated by another layer in which the passage P, the two parabolic reflectors 157 and 158, and the two windows 159 and 160 are formed as shown in FIG. 12, and which also shows the manner in which the filter 161 is positioned. The two windows 159 and 160 together with the layers 155 and 156 define the through passage P and the infrared radiation, filtered as at 161 from the source 162 is guided between the plates 155 and 156 as shown by the dashed lines to the detector 163 to pass through the passage P. It will be noted from FIG. 11 that both the source 162 and the detector 163 project upwardly through the plate 156 into the focal regions of their respective parabolic reflectors 157 and 158. Although not indicated by the dashed lines, the source 162 illuminates the reflector 157 and the detector is illuminated by the reflector 158, as will be well understood by those skilled in the optical art.

As is the case with FIGS. 8 and 9, the sensor of FIGS. 10-12 may be used for humidity measurement or for sensing the presence of a gas for various purposes. For example, detection of the presence of a noxious gas may be important for personnel safety or the detection of a corrosive gas may be important to protect equipment, etc.

The devices of FIGS. 8-12 illustrate the use of the infrared source of this invention for gas analysis. The use of electrooptical systems for gas analysis due to characteristic spectrums in the infrared are known but these systems tend to be complicated and utilize expensive components. Much of the complexity and cost of such systems is involved with the source, the chopper and the optics required. Tunable infrared laser diodes for the infrared have been developed which can be used for high resolution spectroscopy but these devices have narrow band output and are tuned by varying the temperature of the source. They have a number of disadvantages other than the aforesaid complexity and cost. These source devices must be cooled below 77° K. and therefore require two stage cycle coolers for portable operation and, further, have only limited operational lifetimes and they may be subject to mode jumping. With the sources according to this invention, however, all of these problems may be removed as is illustrated in the devices of FIGS. 8–12 above.

Figure 15:
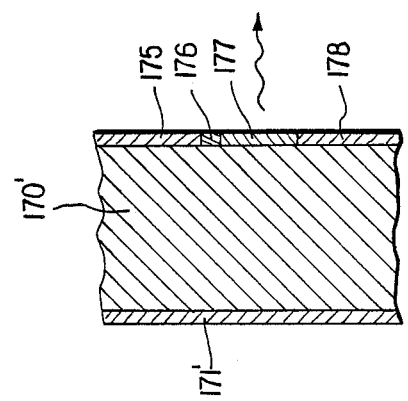
FIG. 15 is a partial sectional view illustrating a portion of an integrated circuit device according to the invention illustrating a further modified form thereof.
Figure 14:
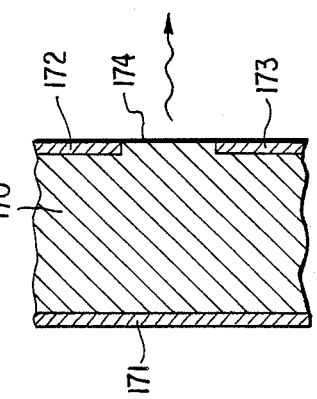
FIG. 14 is a partial sectional view illustrating a portion of an integrated circuit device according to the invention illustrating a modified form of modulating arrangement.
Figure 13:
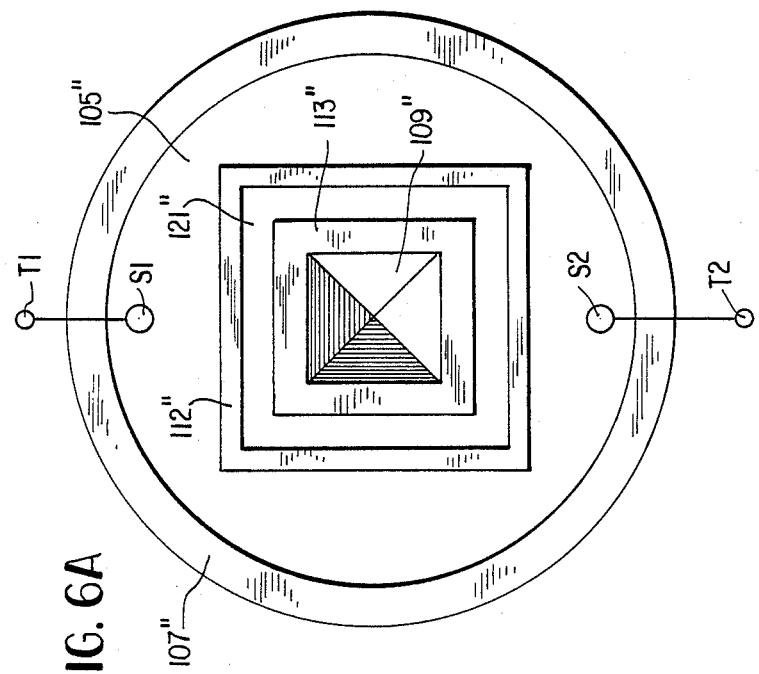
FIG. 13 is a partial sectional view illustrating a portion of an integrated circuit device according to the invention illustrating a modified form of modulating arrangement.

FIGS. 13–15 illustrate means whereby integrated device according to this invention may be constructed to include various forms of modulating arrangements. In FIG. 13, the intrinsic region 170 is provided on one side with the diffused layer 171 which is the infrared radiation source and also includes the p- and n-type regions 172 and 173 which form a lateral type PIN structure for modulation. The gap between the regions 172 and 173 exposing the intrinsic region 170 forms a window 174 through which the emitted radiation is directed.

In the embodiment of FIG. 14, the intrinsic region 170' is provided on one side with the emitting region 171' and, on the opposite side, with the n region 175, the n+ region 176, the p region 177 and the p+ region 178. This type of structure operates to modulate in response to breakdown avalanche when the p and n regions 175, 178 are reverse biassed.

The embodiment of FIG. 15 includes the emitting region 171" and on the opposite side of the intrinsic region 170" with a similar region 179. The region 180 is of type opposite to that of the region 171" to provide a PIN structure for modulation. The lower end of the intrinsic region 170" illustrated is beveled and provided with an oxide coating 181 and the reflective coating 182 so that the output of the device is directed to the right in the Figure, as shown.

It will be appreciated that in FIGS. 13–15, only those portions of the integrated circuit structures illustrative of the principles involved have been shown. Oxide or other coatings such as those illustrated in earlier Figures for other embodiments have not been illustrated in FIGS. 13–15 for purposes of clarity, but it is to be understood that conventional and well known techniques of integrated circuit construction are employed in all cases.

From the above, it will be apparent to those of ordinary skill in the art that the light modifying effect of this invention is due to the modulating presence of carriers within the semiconductor body, the body otherwise being thermally conditioned to emit the radiation in the spectrum of interest. At the temperature to which the body is heated, thermal equilibrium and a corresponding equilibrium concentration of carriers is achieved. When modulation occurs, carriers in excess of the equilibrium concentration are present, during which the intensity of the emitted radiation is modified. Upon cessation of the modulating input, the unmodulated amplitude of the emitted radiation is restored.

The amount of modulation depends upon the amount of modulation carriers present due to the modulation process, and in order to be efficient in terms of current, the carrier lifetimes and hence surface recombination effects must be controlled. This is achieved by covering a major portion of the surface of the semiconductor body with the doped regions, leaving only a minor portion of the surface of the intrinsic material exposed to act as a window for the emitted radiation. In this way, not only is the surface recombination effect reduced but also the device more nearly approaches the characteristics of a black body radiator, thereby providing broadband radiation over a wide spectrum. Both of these factors are important in reducing the power input necessary to the device. Since the device is solid state, the opportunity exists for integrated devices employing a source according to this invention. Indeed, integrated circuitry including integrated optical circuitry is possible using sources according to this invention.

What is claimed is:

1. A radiation-emitting semiconductor device capable of modulation, having radiation-inducing means which thermally conditions the device to emit detectable broadband radiation at a substantially uniform intensity, and modulating means for influencing said device internally thereof to vary the intensity of said broadband radiation which is emitted.

2. A radiation-emitting semiconductor device capable of modulation as defined in claim 1 wherein said radiation-inducing means heats said semiconductor device to a substantially uniform, predetermined temperature at which broadband infrared radiation encompassing a desired frequency spectrum is emitted.

3. A radiation-emitting semiconductor device as defined in claim 2 wherein said radiation-inducing means comprises a heating device disposed externally of the semiconductor device.

4. A radiation-emitting semiconductor device as defined in claim 3 wherein said heating device includes an integrated circuit having resistive means formed therein.

5. A radiation-emitting semiconductor device as defined in claim 4 wherein said integrated circuit includes temperature sensing means.

6. A radiation-emitting semiconductor device as defined in claim 3 wherein said heating device comprises a diode structure.

7. A radiation-emitting semiconductor device as defined in claim 2 wherein said radiation-inducing means comprises a heating device monolithically formed with said semiconductor device.

8. A radiation-emitting semiconductor device as defined in claim 7 wherein said heating device comprises a diode structure.

9. A radiation-emitting semiconductor device as defined in claim 7 wherein said heating device includes an integrated circuit having resistive means formed therein.

10. A radiation-emitting semiconductor device as defined in claim 9 wherein said integrated circuit includes temperature sensing means.

11. A radiation-emitting semiconductor device capable of modulation as defined in claim 2 wherein said modulating means controls the presence of carriers within said device.

12. A radiation-emitting semiconductor device capable of modulation as defined in claim 1 wherein said modulating means controls the presence of carriers within said device.

13. A radiation-emitting semiconductor device as defined in claim 12 wherein said modulating means controls the presence of carriers optically.

14. A radiation-emitting semiconductor device as defined in claim 12 wherein said modulating means controls the presence of carriers electrically.

15. A radiation-emitting semiconductor device capable of modulation, comprising the combination of:
   a semiconductor body having a surface of high emissivity with respect to radiation of a wavelength of interest;

means for heating said body to a desired temperature at which it thermally emits broadband radiation from said surface at a desired intensity and encompassing the wavelength of interest;

means for causing said radiation of the wavelength of interest to follow a path within said body so as to be emitted therefrom with the desired intensity; and modulating means for controllably injecting carriers into the body to intercept said path so as to modulate the intensity of said broadband radiation emitted from said surface.

16. A radiation-emitting semiconductor device as defined in claim 15 wherein said modulating means injects carriers in said body which attain thermal equilibrium.

17. A radiation-emitting semiconductor device as defined in claim 16 wherein said modulating means optically injects said carriers.

18. A radiation-emitting semiconductor device as defined in claim 16 wherein said modulating means electrically injects said carriers.

19. An infrared-emitting semiconductor device capable of modulation comprising the combination of:

a semiconductor having a region which emits infrared radiation when heated and another region which has low emissivity and absorption of said infrared radiation and means for heating said semiconductor to a predetermined temperature so that a desired intensity of infrared radiation is emitted therefrom; and modulating means for controllably injecting carriers into said semiconductor to vary the intensity of the infrared radiation emitted therefrom.

20. An infrared-emitting semiconductor device as defined in claim 19 wherein said modulating means controls the presence of carriers within said another region.

21. An infrared-emitting semiconductor device as defined in claim 20 wherein said modulating means optically creates carriers in said another region.

22. An infrared-emitting semiconductor device as defined in claim 20 wherein said modulating means electrically injects carriers into said another region.

23. A broadband radiation-emitting semiconductor device capable of modulation and comprising the combination of:

a body of radiation-emissive semiconductor material and means for maintaining the temperature of the body at a desired temperature at which it thermally emits radiation over a broad band of frequencies encompassing a wavelength of interest; and modulating means for variably injecting carriers into said semiconductor body correspondingly to control the emittance therefrom of said broadband radiation encompassing the wavelength of interest.

24. A radiation-emitting semiconductor device capable of modulation as defined in claim 23 wherein said modulating means introduces carriers within said semiconductor body which attain thermal equilibrium therewithin.

25. A radiation-emitting semiconductor device as defined in claim 24 wherein said modulating means optically creates carriers in the device.

26. A radiation-emitting semiconductor device as defined in claim 24 wherein said modulating means electrically injects carriers into said device.

27. A radiation-emitting semiconductor device capable of modulation, comprising the combination of:

a semiconductor having an intrinsic region as well as p- and n-regions and providing a surface of said intrinsic region from which unmodulated broadband radiation containing a wavelength of interest may be thermally emitted and means for controlling the temperature of the device to emit the unmodulated broadband radiation from said surface; and modulating means for periodically injecting carriers into said semiconductor to modulate the emittance of said radiation of the wavelength of interest from said surface.

28. A semiconductor device as defined in claim 27 wherein said modulating means controls the presence of carriers within said device which attain thermal equilibrium therewithin.

29. A semiconductor device as defined in claim 28 wherein said modulating means optically creates carriers in said device.

30. A semiconductor device as defined in claim 28 wherein modulating means electrically injects carriers into said device.

31. A semiconductor device as defined in claim 27 wherein said surface of the intrinsic region is of an area relative to the areas of the doped regions of the body of not greater than 1/5 so that the device approximates a black body radiator.

32. In a semiconductor device, the combination of:

a semiconductor body having a surface which exhibits high emissivity of radiation in a desired spectrum;

means for controlling the temperature of the body to emit said radiation in the desired spectrum from said surface through said body; and means for periodically injecting carriers within the semiconductor body to modulate the emitted radiation.

33. In a semiconductor device as defined in claim 32 wherein said modulating means controls the presence of carriers in said body which attain thermal equilibrium therewithin.

34. In a semiconductor device as defined in claim 33 wherein said modulating means optically creates said carriers.

35. In a semiconductor device as defined in claim 33 wherein said modulating means electrically injects said carriers.

36. In combination with a semiconductor device having a doped region which displays a temperature-dependent emissivity for infrared radiation and another region which is of low emissivity and absorption for infrared radiation, means for controlling the temperature of said device to produce said infrared radiation from said doped region, and means for modulating the absorption coefficient of said infrared radiation within said another region to modulate the intensity of the infrared radiation emitted by said device.

37. A device as defined in claim 36 wherein the ratio of exposed surface of said another region to the exposed surface of said doped region is not greater than 1/5 so that the device approaches a black body radiator.

38. A modulated infrared source comprising the combination of a body of semiconductor material having at least one diffused portion having high emissivity for infrared radiation and a further portion having low emissivity and low absorption for the infrared radiation, and means for controlling the temperature of the body to emit infrared radiation at a selected intensity; and modulating means for periodically creating carriers in said body to control emittance of said infrared radiation from said body.

39. A device as defined in claim 38 wherein said further region is an intrinsic region.

40. A device as defined in claim 39 wherein said modulating carriers are injected electrically.

41. A device as defined in claim 39 wherein said modulating carriers are created optically.

42. A solid state infrared source comprising a slab of intrinsic silicon material having doped p- and n-regions on at least its opposite side surfaces so as to expose a minor surface of the intrinsic silicon material, said intrinsic silicon material having low emissivity and low absorption for infrared radiation and said doped regions having high emissivity for the infrared radiation, the combined areas of said doped regions being at least five times larger than said minor surface, means for controlling the temperature of said slab so as to cause broadband infrared radiation to exit through said minor surface, and means for periodically controlling the presence of carriers in said intrinsic silicon material to modulate the infrared radiation from said minor surface.

43. A solid state infrared source comprising a slab of intrinsic silicon material having doped regions covering a major portion of the surface of the slab so as to expose a minor surface of the intrinsic silicon material, said intrinsic silicon material having low emissivity and low absorption for infrared radiation and said doped regions having high emissivity for the infrared radiation, means for heating said slab to a temperature sufficient to cause broadband infrared radiation to exit through said minor surface, and means for periodically controlling the presence of carriers in said intrinsic silicon material correspondingly to modulate the intensity of the broadband infrared radiation from said minor surface.

44. A solid state infrared source comprising a slab of intrinsic silicon material having doped regions covering a portion of the surface of the slab so as to expose a surface of the intrinsic silicon material, said intrinsic silicon material having low emissivity and low absorption for infrared radiation whereas said doped regions are of high emissivity for the infrared radiation, means for heating said slab to a temperature sufficient to cause infrared radiation to exit through said surface of the intrinsic region, and means for periodically controlling the presence of carriers in said intrinsic silicon material correspondingly to modulate the intensity of broadband infrared radiation from said minor surface.

45. A solid state infrared source comprising a slab of intrinsic silicon material presenting opposite side surfaces and circumscribing edge surfaces, said body having doped p- and n-regions on at least its opposite side surfaces so as to expose a minor surface of the intrinsic silicon material, said doped regions defining at least one modulating PIN diode structure, said intrinsic silicon material having low emissivity and low absorption for infrared radiation and said doped regions having high emissivity for the infrared radiation, means for controlling the temperature of the slab to produce broadband infrared radiation which exits through said minor surface, and means for periodically forward biassing said PIN diode structure to control the presence of carriers in said intrinsic silicon material correspondingly to modulate the intensity of the infrared radiation emitted from said minor surface.

46. A solid state infrared source as defined in claim 45 wherein said said minor surface is formed on one of said opposite side surfaces and is surrounded by a doped region, the other side surface in register with said minor surface being etched away and coated with reflective material to reflect the infrared radiation to exit through said minor surface.

47. A solid state infrared source as defined in claim 46 wherein said circumscribing edge surfaces are doped and the combined areas of the doped regions being at least five times larger than the area of said minor surface.

48. A solid state infrared source as defined in claim 47 wherein said slab is circular.

49. A solid state infrared source as defined in claim 47 wherein said slab is rectangular.

50. A solid state infrared source as defined in claim 45 wherein said means for heating comprises a second PIN diode structure formed by said doped regions and means for forward biassing said second PIN diode structure to maintain the slab at a temperature of about 500° K.

51. A solid state infrared source as defined in claim 45 wherein said circumscribing edge surfaces constitute said minor surface and including reflector means surrounding said circumscribing edge surfaces to reflect the infrared radiation, said means for heating comprising resistive heating means bonded to one of said opposite side surfaces for maintaining the temperature of said slab at about 500° K.

52. A solid state infrared source as defined in claim 51 wherein said slab is circular.

53. A solid state infrared source as defined in claim 51 wherein said slab is rectangular.

54. In a gas analysis device including the combination of a solid state infrared source comprising a body of semiconductor material having a doped region and another region which is relatively undoped, means for maintaining said body at a temperature of about 500° K. so that it emits broadband infrared radiation at a desired intensity from said relatively undoped region thereof, means for periodically varying the presence of carriers in said undoped region of the body correspondingly to modulate the intensity of the infrared radiation emitted from said relatively undoped region, detecting means for detecting infrared radiation and disposed in spaced relation to said source, and means defining an optical path between said source and said detector means through ambient atmosphere for analysis of gas contained in the ambient atmosphere.

* * * * *